(12) United States Patent
Hong et al.

(10) Patent No.: US 9,105,616 B2
(45) Date of Patent: Aug. 11, 2015

(54) EXTERNAL CONNECTION TERMINAL, SEMICONDUCTOR PACKAGE HAVING EXTERNAL CONNECTION TERMINAL, AND METHODS FOR MANUFACTURING THE SAME

(71) Applicant: SAMSUNG ELECTRO-MECHANICS CO., LTD., Suwon-si (KR)

(72) Inventors: Chang Seob Hong, Suwon-si (KR); Eun Jung Jo, Suwon-si (KR); Kyu Hwan Oh, Suwon-si (KR); Kang Hyun Lee, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/142,719

(22) Filed: Dec. 27, 2013

(65) Prior Publication Data
US 2015/0091177 A1    Apr. 2, 2015

(30) Foreign Application Priority Data
Sep. 27, 2013    (KR) .................. 10-2013-0115581

(51) Int. Cl.
*H01L 23/48*    (2006.01)
*H01L 23/482*    (2006.01)
*H01L 23/00*    (2006.01)

(52) U.S. Cl.
CPC .............. *H01L 23/482* (2013.01); *H01L 24/29* (2013.01)

(58) Field of Classification Search
USPC .......... 257/737, 738, 697, E23.021, E23.069, 257/693, E23.024, E23.025, 723; 228/180.22; 438/106, 107, 108
See application file for complete search history.

(56) References Cited

U.S. PATENT DOCUMENTS

| 5,508,228 | A | * | 4/1996 | Nolan et al. .................. 438/614 |
| 5,925,930 | A | * | 7/1999 | Farnworth et al. ............ 257/737 |
| 6,586,830 | B2 | * | 7/2003 | Saito ............................. 257/700 |
| 7,462,940 | B2 | * | 12/2008 | Bauer et al. ................... 257/778 |
| 7,932,600 | B2 | * | 4/2011 | Tsang et al. .................. 257/737 |
| 7,977,788 | B2 | * | 7/2011 | Chang et al. .................. 257/737 |
| 2006/0125079 | A1 | * | 6/2006 | Wyland et al. ................ 257/693 |
| 2007/0228549 | A1 | * | 10/2007 | Hsu et al. ...................... 257/698 |
| 2012/0164790 | A1 | | 6/2012 | Ishihara |

FOREIGN PATENT DOCUMENTS

WO    2005-078796    8/2005

* cited by examiner

*Primary Examiner* — Jasmine Clark
(74) *Attorney, Agent, or Firm* — Ladas & Parry, LLP

(57) ABSTRACT

Disclosed herein are an external connection terminal part, a semiconductor package having the external connection terminal part, and a method for manufacturing the same. According to a preferred embodiment of the present invention, the external connection terminal part includes an insulating material and metal plating pattern formed on both surfaces of the insulating material.

20 Claims, 11 Drawing Sheets

EXTERNAL CONNECTION TERMINAL, SEMICONDUCTOR PACKAGE HAVING EXTERNAL CONNECTION TERMINAL, AND METHODS FOR MANUFACTURING THE SAME

CROSS REFERENCE TO RELATED APPLICATION

This application claims the benefit of Korean Patent Application No. 10-2013-0115581, filed on Sep. 27, 2013, entitled "External Connection Terminal and Semi-conductor Package Having External Connection Terminal and Methods Thereof", which is hereby incorporated by reference in its entirety into this application.

BACKGROUND OF THE INVENTION

1. Technical Field

The present invention relates to an external connection terminal, a semiconductor package having the external connection terminal, and a method for manufacturing the same.

2. Description of the Related Art

Recently, many semiconductor devices tend to be packaged in high density and high integration for electronic devices to simultaneously perform many functions.

As a result, a market tends to demand miniaturization of the electronic devices. Therefore, as the package is developed to a module having an integration system type, the package size is getting smaller and the mounting density also has a tendency to be high density.

Further, a method for integrating various packages has been developed to implement the package in one integration type. Recently, a double side packaging technology using both surfaces of a printed circuit board (PCB) becomes gradually important, a chip surface mounting technology (chip SMT) for mounting a chip on a lower portion of the double side substrate, and a technology for implementing a solder ball connection terminal for connecting to an electronic device board become important.

A technology applied to a double side packaging product is being developed to a technology for implementing a connection terminal between the package and the board by connecting a copper pin (Cu pin) to the lower portion of the substrate by soldering and a technology for molding the overall lower portion, penetrating through a terminal of the substrate using a laser beam, and then plating a portion of a through hole with a conductive material to implement the connection terminal.

However, in order to apply these technologies, as a complicated package process is required and mechanical elements are very large, a tolerance may be relatively large and as the number of interconnections on the upper and lower portions of the substrate increases, the package size cannot but increase. In order to solve the problems, a packaging method for separately forming the interconnection as a fine pattern and attaching the interconnection to the substrate has been proposed.

PRIOR ART DOCUMENT

Patent Document (Patent Document 1) (Cited Document) US Patent Laid-Open Publication No. 2012-0164790
(Patent Document 2) (Cited Document) International Patent Publication No. WO 2005-078796

SUMMARY OF THE INVENTION

The present invention has been made in an effort to provide an external connection terminal part capable of efficiently implementing a desired pattern and being easily formed as a fine pattern.

Further, the present invention has been made in an effort to provide a method for manufacturing an external connection terminal part capable of being easily mass produced by being cut at a desired size.

In addition, the present invention has been made in an effort to provide a semiconductor package capable of being minimized by including an external connection terminal part which is easily formed as a fine pattern.

Moreover, the present invention has been made in an effort to provide a method for manufacturing a semiconductor package capable of simplifying a manufacturing process of a semiconductor package and saving process costs by attaching an external connection terminal part to the semiconductor package.

According to a preferred embodiment of the present invention, there is provided an external connection terminal part, including: an insulating material; and metal plating patterns formed on both surfaces of the insulating material.

The insulating material may have a plate shape.

The external connection terminal part may further include: an insulating coating material formed to expose the metal plating patterns on both surfaces of the insulating material.

According to another preferred embodiment of the present invention, there is provided a method for manufacturing an external connection terminal part, including: preparing an insulating material; and forming metal plating patterns on both surfaces of the insulating material.

The insulating material may have a plate shape.

The method for manufacturing an external connection terminal part may further include: after the forming of the metal plating patterns, forming an insulating coating material to expose the metal plating patterns on both surfaces of the insulating material.

The method for manufacturing an external connection terminal part may further include: after the forming of the metal plating patterns, exposing surfaces of the metal plating patterns by polishing two opposite surfaces of the insulating material.

The method for manufacturing an external connection terminal part may further include: after the forming of the metal plating patterns, exposing surfaces of the metal plating patterns by cutting the two opposite surfaces of the insulating material.

The method for manufacturing an external connection terminal part may further include: after the forming of the metal plating patterns, cutting the insulating material in a plurality of units.

According to still another preferred embodiment of the present invention, there is provided a semiconductor package including: a substrate on which a double-sided mounting electrode is formed; a plurality of electronic devices mounted on both surfaces of the substrate; and external connection terminal parts each attached to outer sides of a lower surface of the substrate, wherein the external connection terminal part includes a resin in which a glass fiber is impregnated and metal plating patterns formed on both surfaces of the resin.

The resin may have a plate shape.

The semiconductor package may further include: an insulating coating material formed to expose the metal plating patterns formed on both surfaces of the resin.

The external connection terminal part may be attached to the substrate by soldering, an adhesive material, or the two attaching methods.

According to still yet another preferred embodiment of the present invention, there is provided a method for manufacturing a semiconductor package, including: mounting a plurality of electronic devices on an upper surface of a substrate on which a double-sided mounting electrode is formed; mounting the plurality of electronic devices on a lower surface of the substrate; and attaching external connection terminal parts each disposed to outer sides of a lower surface of the substrate, wherein the external connection terminal part includes a resin in which a glass fiber is impregnated and metal plating patterns formed on both surfaces of the resin.

The method for manufacturing a semiconductor package may further include: forming an insulating coating material so as to expose the metal plating patterns formed on both surfaces of the resin.

The external connection terminal part may be attached to the substrate by soldering, an adhesive material, or the two attaching methods.

The method for manufacturing a semiconductor package may further include: after the mounting of the electronic device on the upper surface of the substrate, forming a molding part on the upper surface of the substrate to cover the whole of the electronic device mounted on the upper surface of the substrate and the upper surface of the substrate.

The method for manufacturing a semiconductor package may further include: after the mounting of the electronic device on the lower surface of the substrate, forming a molding part on the lower surface of the substrate to cover the whole of the electronic device mounted on the lower surface of the substrate.

The method for manufacturing a semiconductor package may further include: after the connecting of the external connection terminal part to an outer side of the lower surface of the substrate, forming a molding part on the whole of the lower surface of the substrate to cover the electronic device mounted on the lower surface of the substrate and the external connection terminal part.

The molding part may be formed by transfer or injection molding.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
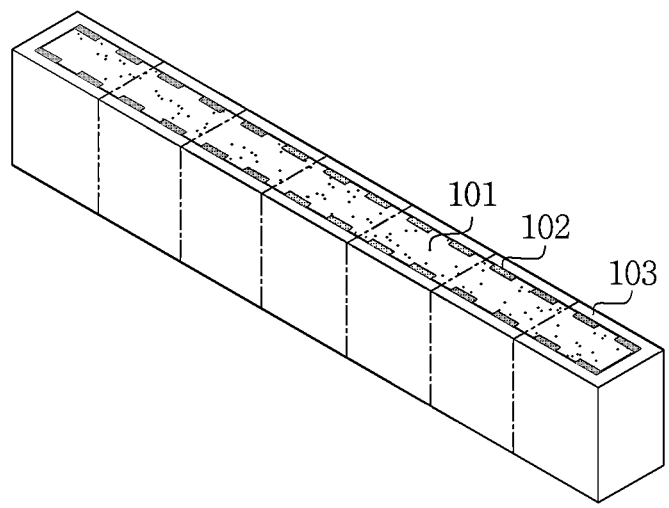
FIG. 1 is a cross-sectional view schematically showing a structure of an external connection terminal part according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

External Connection Terminal Part

FIG. 1 illustrates a structure of an external connection terminal part 100 according to a preferred embodiment of the present invention.

The external connection terminal part 100 according to the preferred embodiment of the present invention includes an insulating material 101 and metal plating patterns 102 which are formed on both surfaces of the insulating material 101.

In this configuration, as the insulating material 101, a plate-shaped insulating material 101 may be used.

As the insulating material 101, a thermosetting resin such as epoxy resin, a thermoplastic resin such as polyimide, a resin having a reinforcement material such as a glass fiber or inorganic filler impregnated in the thermosetting resin and the thermoplastic resin, for example, a prepreg may be used. In addition, as the insulating material, the thermosetting resin and/or a photo-curable resin, and the like, may be used. However, the insulating material is not particularly limited thereto.

Here, the metal plating pattern 102 may be manufactured in various forms, including a column form.

A plated surface is thinly formed by performing electroless plating on both surfaces of the insulating material 101 and is then etched to be removed, thereby forming a pattern.

When a thicker plating layer is formed to secure a solder ball contact surface, an electroless plating layer having a thickness of about 1 μm is formed and then the pattern is displayed and suffers from electroplating to control its thickness.

An insulating coating material 103 which encloses the insulating material 101 formed as above and the metal plating patterns 102 formed on both surfaces of the insulating material 101 is formed.

In this case, the insulating coating material 103 is formed to expose the metal plating pattern 102 of the external connection terminal part 100.

In this case, as the insulating coating material 103, a silicon gel, an epoxy molded compound (EMC), and the like, may be used, but the preferred embodiment of the present invention is not limited thereto.

According to the preferred embodiment of the present invention, the external connection terminal part 100 may be implemented to have the designer's desired shape by plating the insulating material with the conductive material in various patterns and may be easily formed as the fine pattern.

Method For Manufacturing External Connection Terminal Part

FIGS. 2 to 7 sequentially illustrate a method for manufacturing the external connection terminal part 100 according to a preferred embodiment of the present invention.

Figure 2:
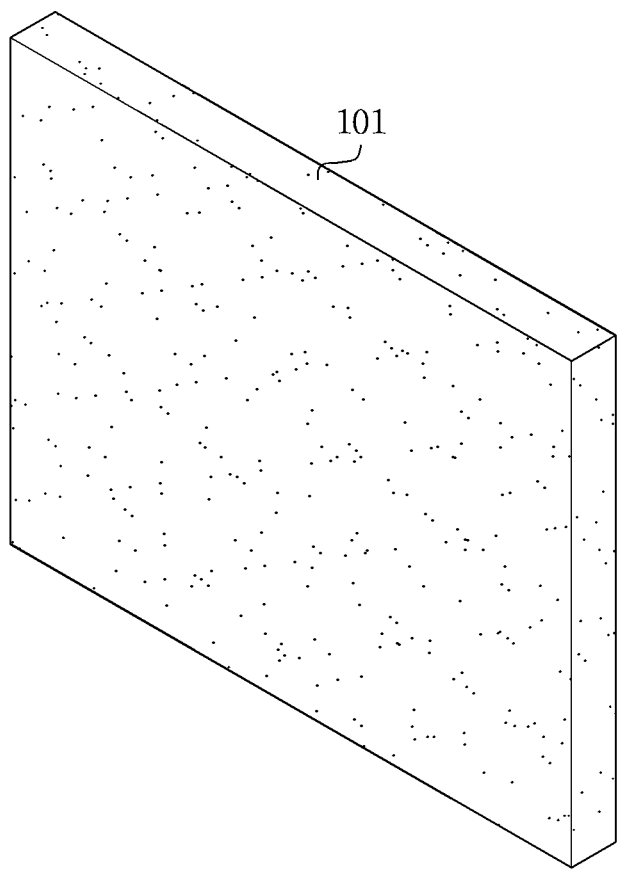
FIGS. 2 to 7 are process cross-sectional views sequentially illustrating a method for manufacturing an external connection terminal part according to a preferred embodiment of the present invention.

Referring first to FIG. 2, a plate-shaped insulating material 101 is prepared.

As the insulating material 101, a thermosetting resin such as epoxy resin, a thermoplastic resin such as polyimide, a resin having a reinforcement material such as a glass fiber or inorganic filler impregnated in the thermosetting resin and the thermoplastic resin, for example, a prepreg may be used. In addition, as the insulating material, the thermosetting resin and/or a photo-curable resin, and the like, may be used. However, the insulating material is not particularly limited thereto.

Figure 3:
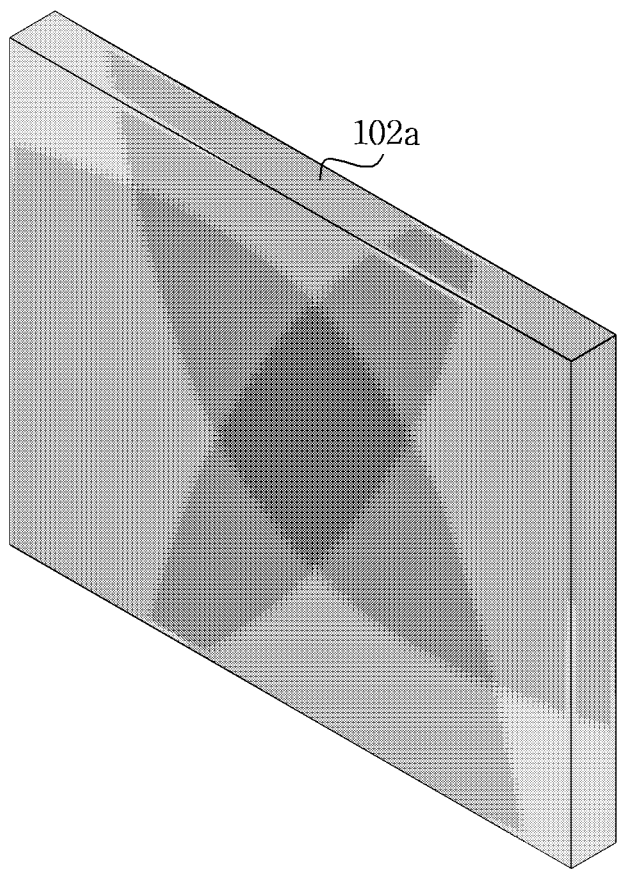

Referring to FIG. 3, a metal plating layer 102a is formed on an outer layer of the insulating material 101 by the electroless plating.

Figure 4:
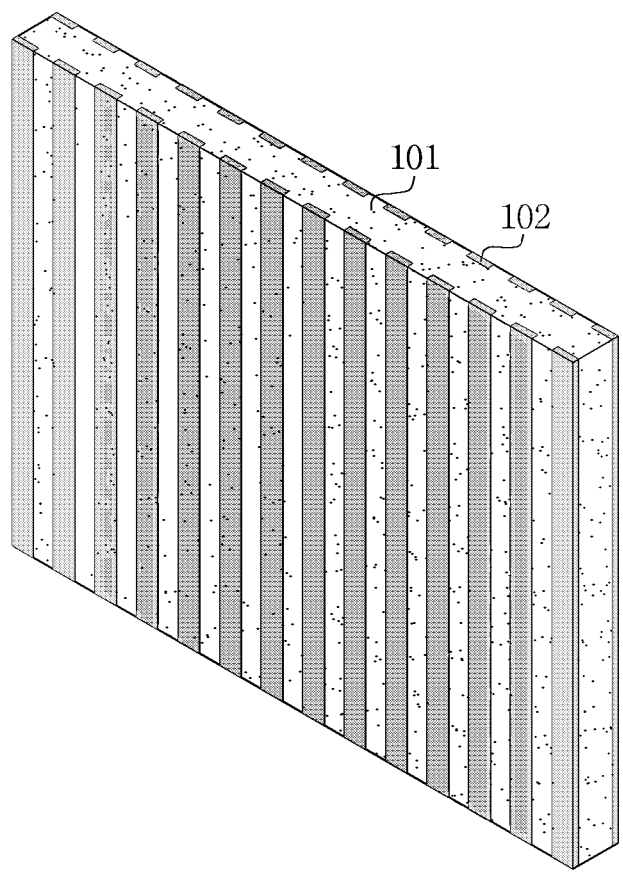

Referring to FIG. 4, a pattern is displayed on the metal plating layer 102a and is etched depending on the desired pattern form to selectively remove a pattern part of the metal plating layer 102a, thereby forming the metal plating pattern 102.

Here, the metal plating pattern 102 may be manufactured in various forms, including a column form.

A plated surface is thinly formed by performing electroless plating on both surfaces of the insulating material 101 and is etched to be removed, thereby forming a pattern.

When the thicker plating layer is formed to secure the solder ball contact surface, the electroless plating layer having a thickness of about 1 μm is formed and then the pattern is displayed and suffers from the electroplating to control its thickness.

Figure 5:
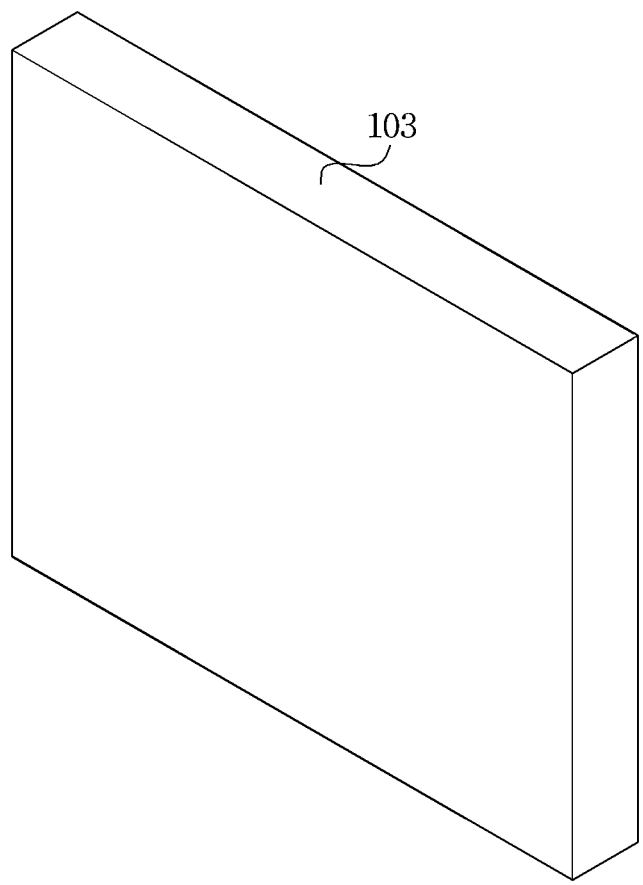

Referring to FIG. 5, the overall plate is coated with the insulating coating material 103.

In this case, as the insulating coating material 103, a silicon gel, an epoxy molded compound (EMC), and the like, may be used, but the preferred embodiment of the present invention is not limited thereto.

Figure 6:
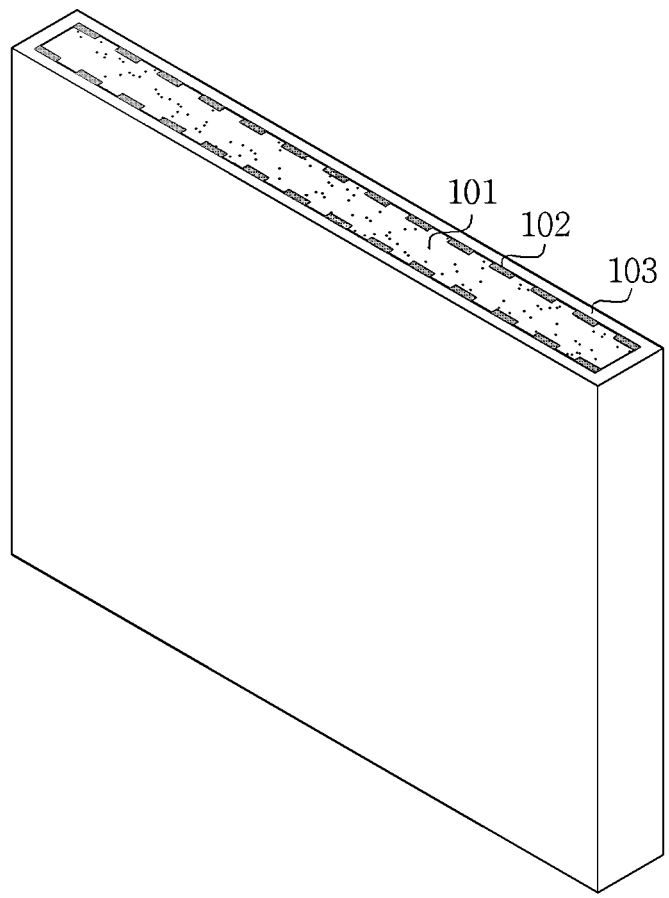

Referring to FIG. 6, two opposite surfaces of the insulating material 101 are polished and/or cut to expose the metal plating pattern 102.

Figure 7:
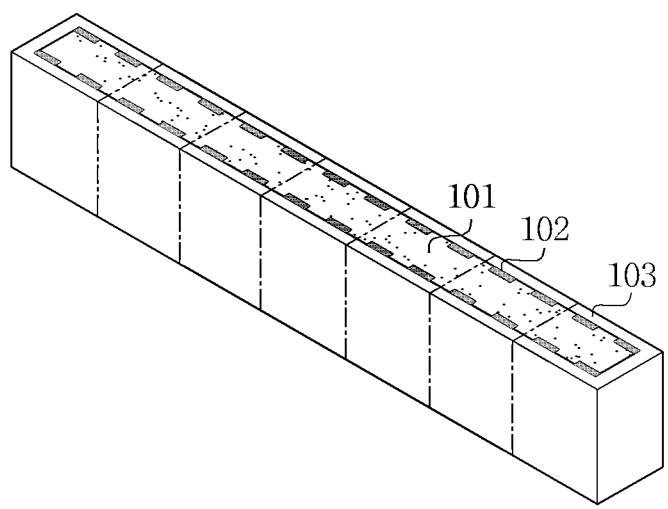

Referring to FIG. 7, the insulating material 101 is cut into a plurality of units and a size and a shape thereof may be various.

Further, the method for manufacturing the external connection terminal part 100 according to the preferred embodiment of the present invention may be easily mass produced at the time of manufacturing and may be cut at the desired size to simplify the process and save the process costs.

Semiconductor Package Having External Connection Terminal Part

<Preferred Embodiment>

Figure 8:
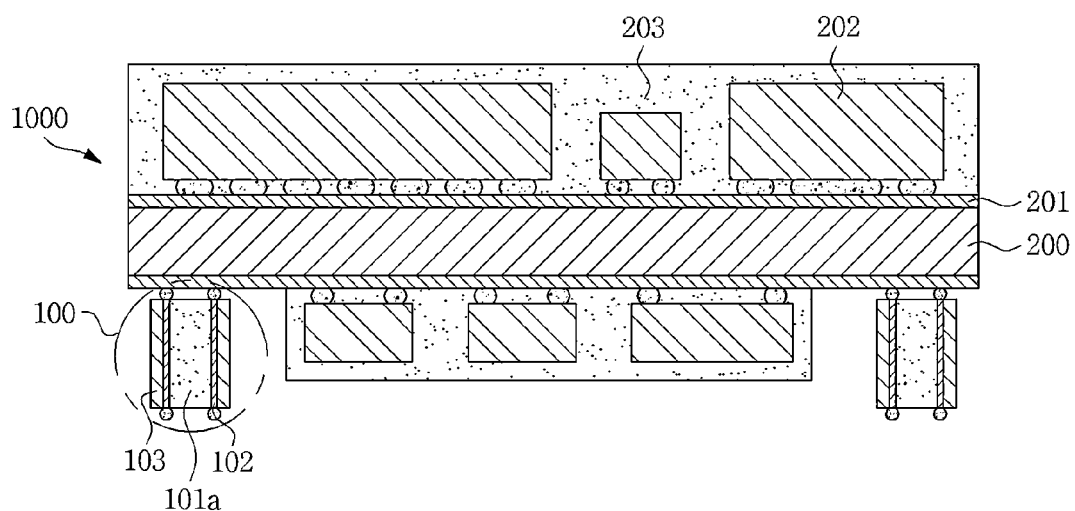
FIG. 8 is a cross-sectional view schematically illustrating the structure of a semiconductor package having an external connection terminal part according to a preferred embodiment of the present invention.
Figure 9:
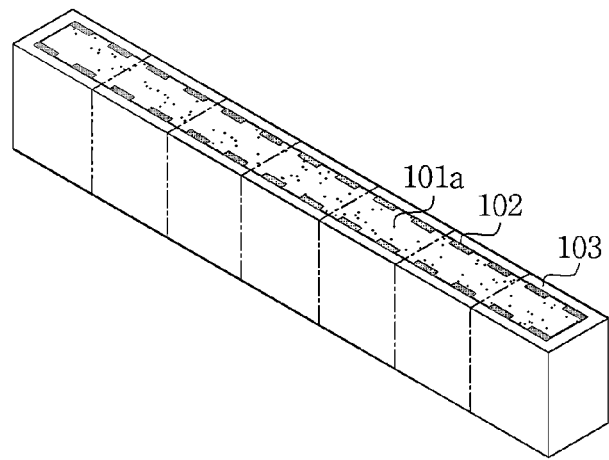
FIG. 9 is an enlarged perspective view of a part (external connection terminal part) 100 of FIG. 8.

FIG. 8 illustrates a structure of a semiconductor package 1000 having the external connection terminal part 100 according to the preferred embodiment of the present invention.

The semiconductor package 1000 having the external connection terminal part 100 according to the preferred embodiment of the present invention includes a substrate 200 on which a double-sided mounting electrode 201 is formed, a plurality of electronic devices 202 which are mounted on both surfaces of the substrate 200, and the external connection terminal parts 100 each attached to outer sides of a lower surface of the substrate 200 and in the semiconductor package 1000, the external connection terminal part 100 includes a resin 101a in which a glass fiber is impregnated and the metal plating patterns 102 which are formed on both surfaces of the resin 101a in which the glass fiber is impregnated.

In this configuration, the external connection terminal part 100 includes the resin 101a in which the glass fiber is impregnated and the metal plating patterns 102 which are formed on both surfaces of the resin 101a in which the glass fiber is impregnated.

In this case, as the resin 101a in which the glass fiber is impregnated, the plate-shaped resin 101a may be used.

As the resin 101a in which the glass fiber is impregnated, a thermosetting resin such as epoxy resin, a thermoplastic resin such as polyimide, a resin having a reinforcement material such as a glass fiber or an inorganic filler impregnated in the thermosetting resin and the thermoplastic resin, for example, a prepreg may be used. In addition, as the insulating material, the thermosetting resin and/or a photo-curable resin, and the like, may be used. However, the resin 101a is not particularly limited thereto.

Here, the metal plating pattern 102 may be manufactured in various forms, including a column form.

The plated surface is thinly formed by performing the electroless plating on both surfaces of the resin 101a in which the glass fiber is impregnated and is then etched to be removed, thereby forming the pattern.

When the thicker plating layer is formed to secure the solder ball contact surface, the electroless plating layer having a thickness of about 1 μm is formed and then the pattern is displayed and suffers from the electroplating to control its thickness.

The insulating coating material 103 which encloses the resin 101a formed as above and the metal plating patterns 102 formed on both surfaces of the resin 101a having the glass fiber impregnated therein is formed.

In this case, the insulating coating material 103 is formed to expose the metal plating pattern 102 of the external connection terminal part 100.

In this case, as the insulating coating material 103, a silicon gel, an epoxy molded compound (EMC), and the like, may be used, but the preferred embodiment of the present invention is not limited thereto.

The external connection terminal part 100 serves to electrically and physically connect the semiconductor package 1000 to a main substrate (not illustrated) on which the semiconductor package 1000 is mounted.

In this case, the substrate 200 on which the double-sided mounting electrode 201 is formed may be made of a material called copper clad lamination (CCL) which has a basic member having a film shape including a resin material and a copper clad layer having patterns formed on both surfaces thereof and as the resin material which is the basic material, a thermosetting resin such as epoxy resin, a thermoplastic resin such as polyimide, polyethylene terephthalate (PET), or a resin having a reinforcement material such as a glass fiber or an inorganic filler impregnated in the thermosetting resin and the thermoplastic resin, for example, a prepreg may be used. In addition, as the resin material, the thermosetting resin and/or a photo-curable resin, and the like, may be used. However, the resin material is not particularly limited thereto.

The substrate 200 is provided with the copper clad layer having the patterns formed on both surfaces thereof and may be called a connection pad and/or a circuit layer.

If the connection pad or/and the circuit layer having the patterns formed on both surfaces thereof are used as a conductive metal, any connection pad or/and circuit layer may be used without being limited and typically copper may be used in the printed circuit board.

The substrate 200 may be a circuit board formed with a circuit of at least one layer, preferably, may be a printed circuit board.

For convenience of explanation, a detailed configuration of an inner layer circuit is not illustrated in FIG. 8, but it may be sufficiently recognized by those skilled in the art that a general circuit board on which the circuit of at least one layer is formed on the insulating layer may be used.

At least one electronic device is mounted on both surfaces of the substrate 200, respectively. Further, wiring patterns for electrically connecting between the mounting electrodes 201 for mounting the electronic devices 202 may be formed on both surfaces of the substrate 200.

Here, the electronic device 202 includes various devices, such as passive devices and active devices and any device which may be mounted on the substrate 200 may be used as the electronic devices.

All the electronic devices 202 may be mounted on the upper and lower surfaces of the substrate 200.

The electronic devices 202 may be disposed on both surfaces of the substrate 200 in various forms, depending on its size or shape and a design of the semiconductor package 1000.

Further, the semiconductor package 1000 having the external connection terminal part 100 according to the preferred embodiment of the present invention further includes a molding part 203 which is formed to cover the whole of the upper surface of the substrate 200 and the electronic device 202.

In this case, since the molding part 203 is formed to be filled on the upper surface of the substrate 200, an adhesion between the molding and the substrate 200 is increased, such that the occurrence of problems, such as delamination between the substrate 200 and the molding material, may be reduced, thereby improving the long-term reliability of the substrate 200.

Further, since the heat blocking is performed due to the molding, a heat dissipation effect may be more improved.

In this case, as a material of the molding part 203, the silicon gel, the epoxy molded compound (EMC), and the like, may be used, but the preferred embodiment of the present invention is not limited thereto.

Further, the external connection terminal part 100 is attached to the substrate 200 by soldering, an adhesive material, or the two attaching methods.

Here, as the soldering, for example, a Sn—Pb eutectic solder or a lead-free solder such as Sn—Ag—Cu may be used. Further, the soldering method may be performed by a process of applying a solder paste using a metal mask. However, the soldering method is not limited thereto.

Further, the adhesive material may be an underfill.

As an underfill solution, the thermosetting resin, such as epoxy resin, phenol resin, melamine resin, and ketone resin or ones made of a precursor (cured or semi-cured thermosetting resin) are mainly used, but the epoxy resin may be mainly used.

The underfill solution has high fluidity, is easily charged even in a narrow space, is easily handled, is cured and then has solid and excellent mechanical characteristics.

An example of the epoxy resin may include, for example, a bisphenol type epoxy resin, a novolac type epoxy resin, a naphthalene type epoxy resin, a biphenyl type epoxy resin, a cyclopentadiene type epoxy resin, and the like. One kind of these resins may be used alone and a mixture resin of at least two different kinds may also be used.

The external connection terminal parts 100 formed at outer sides of the lower surface of the substrate 200 may be further molded.

<Another Preferred Embodiment>

Figure 10:
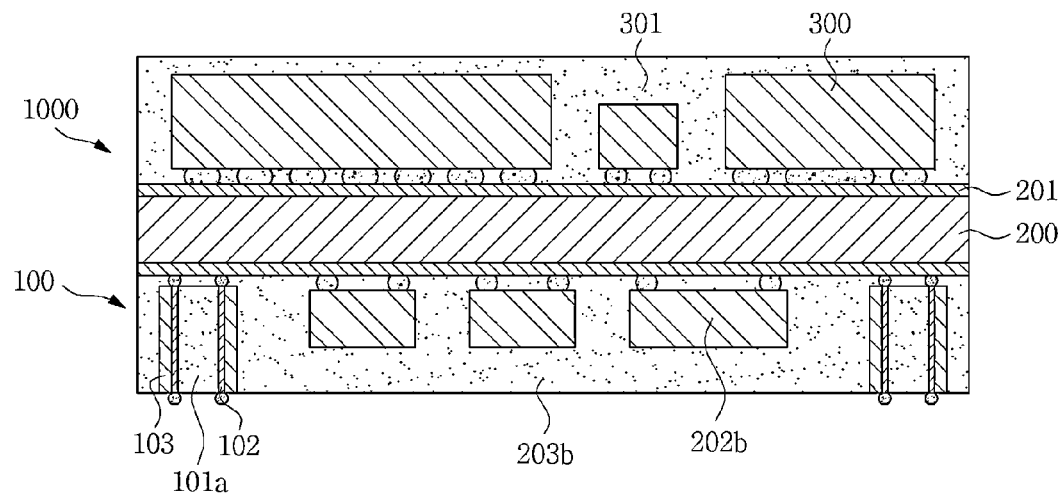
FIG. 10 is a cross-sectional view schematically illustrating a structure of a semiconductor package having an external connection terminal part according to another preferred embodiment of the present invention.

FIG. 10 illustrates a structure of the semiconductor package 1000 having the external connection terminal part 100 according to another preferred embodiment of the present invention.

The semiconductor package 1000 having the external connection terminal part 100 according to the preferred embodiment of the present invention includes the substrate 200 on which the double-sided mounting electrode 201 is formed, the plurality of electronic devices 202 which are mounted on both surfaces of the substrate 200, and the external connection terminal parts 100 each attached to the outer sides of the lower surface of the substrate 200 and in the semiconductor package 1000, the external connection terminal part 100 includes the resin 101a in which a glass fiber is impregnated and the metal plating patterns 102 which are formed on both surfaces of the resin 101a in which the glass fiber is impregnated.

In this configuration, the external connection terminal part 100 includes the resin 101a in which the glass fiber is impregnated and the metal plating patterns 102 which are formed on both surfaces of the resin 101a in which the glass fiber is impregnated.

In this case, the resin 101a in which the glass fiber is impregnated may have the plate shape.

As the resin 101a in which the glass fiber is impregnated, a thermosetting resin such as epoxy resin, a thermoplastic resin such as polyimide, a resin having a reinforcement material such as a glass fiber or an inorganic filler impregnated in the thermosetting resin and the thermoplastic resin, for example, a prepreg may be used. In addition, as the insulating material, the thermosetting resin and/or a photo-curable resin, and the like, may be used. However, the resin 101a is not particularly limited thereto.

Here, the metal plating pattern 102 may be manufactured in various forms, including a column form.

The plated surface is thinly formed by performing the electroless plating on both surfaces of the resin 101a in which the glass fiber is impregnated and is then etched to be removed, thereby forming the pattern.

When the thicker plating layer is formed to secure the solder ball contact surface, the electroless plating layer having a thickness of about 1 μm is formed and then the pattern is displayed and suffers from the electroplating to control its thickness.

The insulating coating material 103 which encloses the resin 101a having the glass fiber impregnated therein formed as above and the metal plating patterns 102 formed on both surfaces of the resin 101a having the glass fiber impregnated therein is formed.

In this case, the insulating coating material 103 is formed to expose the metal plating pattern 102 of the external connection terminal part 100.

In this case, as the insulating coating material 103, the silicon gel, the epoxy molded compound (EMC), and the like, may be used, but the preferred embodiment of the present invention is not limited thereto.

The external connection terminal part 100 serves to electrically and physically connect the semiconductor package 1000 to a main substrate (not illustrated) on which the semiconductor package 1000 is mounted.

In this case, the substrate 200 on which the double-sided mounting electrode 201 is formed may be made of a material called copper clad lamination (CCL) which has a basic member having a film shape including a resin material and a copper clad layer having patterns formed on both surfaces thereof and as the resin material which is the basic material, a thermosetting resin such as epoxy resin, a thermoplastic resin such as polyimide, polyethylene terephthalate (PET), or a resin having a reinforcement material such as a glass fiber or an inorganic filler impregnated in the thermosetting resin and the thermoplastic resin, for example, a prepreg may be used. In addition, as the resin material, the thermosetting resin and/or a photo-curable resin, and the like, may be used. However, the resin material is not particularly limited thereto.

The substrate 200 is provided with the copper clad layer having the patterns formed on both surfaces thereof and may be called a connection pad or/and a circuit layer.

If the connection pad or/and the circuit layer having the patterns formed on both surfaces thereof are used as a conductive metal, any connection pad or/and circuit layer may be used without being limited and typically copper may be used in the printed circuit board.

The substrate 200 may be a circuit board formed with a circuit of at least one layer, preferably, may be a printed circuit board.

For convenience of explanation, a detailed configuration of an inner layer circuit is not illustrated in FIG. 10, but it may be sufficiently recognized by those skilled in the art that a general circuit board on which the circuit of at least one layer is formed on the insulating layer may be used.

At least one electronic device is mounted on both surfaces of the substrate 200, respectively. Further, the wiring patterns for electrically connecting between the mounting electrodes 201 for mounting the electronic devices 202 may be formed on both surfaces of the substrate 200.

Here, the electronic device 202 includes various devices, such as passive devices and active devices and any device which may be mounted on the substrate 200 may be used as the electronic devices.

All the electronic devices 202 may be mounted on the upper and lower surfaces of the substrate 200.

The electronic devices 202 may be disposed on both surfaces of the substrate 200 in various forms, depending on its size or shape and the design of the semiconductor package 1000.

Further, the semiconductor package 1000 having the external connection terminal part 100 according to another preferred embodiment of the present invention further includes the molding part 203 which is formed to cover the whole of the upper and lower surfaces of the substrate 200 and the electronic devices 202.

In this case, since the molding part 203 is formed to be filled on the upper surface of the substrate 200, an adhesion between the molding and the substrate 200 is increased, such that the occurrence of problems, such as delamination between the substrate 200 and the molding material, may be reduced, thereby improving the long-term reliability of the substrate 200.

Further, since the heat blocking is performed due to the molding, a heat dissipation effect may be more improved.

In this case, as the material of the molding part 203, the silicon gel, the epoxy molded compound (EMC), and the like, may be used, but the preferred embodiment of the present invention is not limited thereto.

In this case, the external connection terminal part 100 serves as a support and therefore may suffer from a transfer molding process and if necessary, may be formed by an injection molding process.

In this case, the same amount of molding material is injected onto both surfaces of the substrate 200 to be able to control the occurrence of warpage due to a contraction of materials, such as the epoxy molded compound (EMC).

Further, the external connection terminal part 100 is attached to the substrate 200 by soldering, an adhesive material, or the two attaching methods.

Here, as the soldering, for example, a Sn—Pb eutectic solder or a lead-free solder such as Sn—Ag—Cu may be used. Further, the soldering method may be performed by a process of applying a solder paste using a metal mask. However, the soldering method is not limited thereto.

Further, the adhesive material may be an underfill.

As an underfill solution, the thermosetting resin, such as epoxy resin, phenol resin, melamine resin, and ketone resin or ones made of the precursor (cured or semi-cured thermosetting resin) are mainly used, but the epoxy resin may be mainly used.

The underfill solution has high fluidity, is easily charged even in a narrow space, is easily handled, is cured and then has the solid and excellent mechanical characteristics.

An example of the epoxy resin may include, for example, a bisphenol type epoxy resin, a novolac type epoxy resin, a naphthalene type epoxy resin, a biphenyl type epoxy resin, a cyclopentadiene type epoxy resin, and the like. One kind of these resins may be used alone and a mixture resin of at least two different kinds may also be used.

The external connection terminal parts 100 formed at the outer sides of the lower surface of the substrate 200 may be further molded.

The semiconductor package 1000 having the external connection terminal part 100 according to the preferred embodiment of the present invention may be manufactured by the simple process and have the reduced process costs by forming the external connection terminal part 100 and attaching the external connection terminal part to the package by the simple method.

Further, the external connection terminal part 100 is finely implemented to be able to miniaturize the semiconductor package 1000.

Method for Manufacturing Semiconductor Package Having External Connection Terminal Part <Preferred Embodiment>

FIGS. 11 to 15 are process cross-sectional views sequentially illustrating a method for manufacturing the semiconductor package 1000 having the external connection terminal part 100 according to a preferred embodiment of the present invention.

Figure 11:
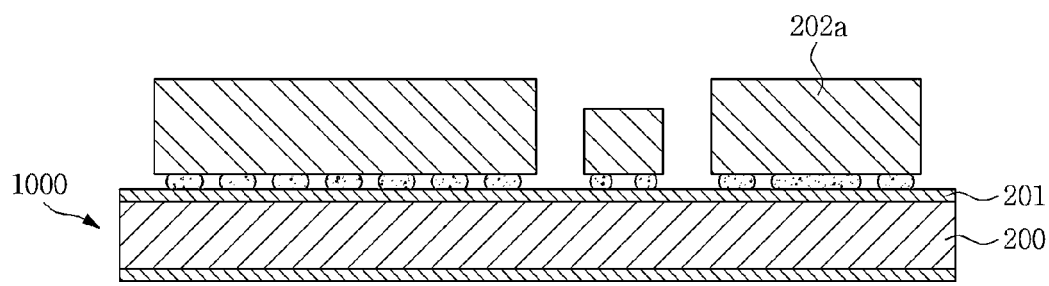
FIGS. 11 to 15 are process cross-sectional views sequentially illustrating a method for manufacturing a semiconductor package having an external connection terminal part according to a preferred embodiment of the present invention.

Referring first to FIG. 11, the substrate 200 on which the double-sided mounting electrode 201 is formed is prepared and the upper surface thereof is mounted with the plurality of electronic devices 202.

In this case, the substrate 200 on which the double-sided mounting electrode 201 is formed may be made of a material called copper clad lamination (CCL) which has a basic member having a film shape including a resin material and a copper clad layer having patterns formed on both surfaces thereof and as the resin material which is the basic material, a thermosetting resin such as epoxy resin, a thermoplastic resin such as polyimide, polyethylene terephthalate (PET), or a resin having a reinforcement material such as a glass fiber or an inorganic filler impregnated in the thermosetting resin and the thermoplastic resin, for example, a prepreg may be used. In addition, as the resin material, the thermosetting resin and/or a photo-curable resin, and the like, may be used. However, the resin material is not particularly limited thereto.

The substrate 200 is provided with the copper clad layer having the patterns formed on both surfaces thereof and may be called a connection pad or/and a circuit layer.

If the connection pad or/and the circuit layer having the patterns formed on both surfaces thereof are used as a conductive metal, any connection pad or/and circuit layer may be used without being limited and typically copper may be used in the printed circuit board.

The substrate 200 may be a circuit board formed with a circuit of at least one layer, preferably, may be a printed circuit board.

For convenience of explanation, a detailed configuration of an inner layer circuit is not illustrated in FIG. 11, but it may be sufficiently recognized by those skilled in the art that a general circuit board on which the circuit of at least one layer is formed on the insulating layer may be used.

At least one electronic device is mounted on both surfaces of the substrate 200, respectively. Further, the wiring patterns for electrically connecting between the mounting electrodes 201 for mounting the electronic devices 202 may be formed on both surfaces of the substrate 200.

Figure 12:
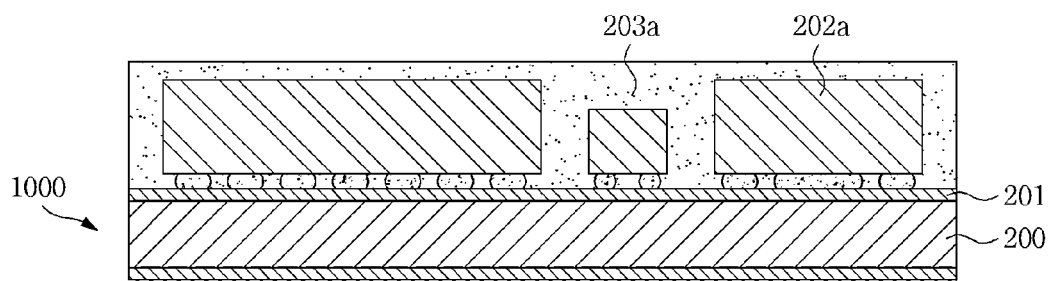

Next, referring to FIG. 12, a molding part 203a is formed on the upper surface of the substrate.

In this case, the whole of the electronic device 202a on the upper surface of the substrate 200 and the mounted upper surface thereof is molded.

Figure 13:
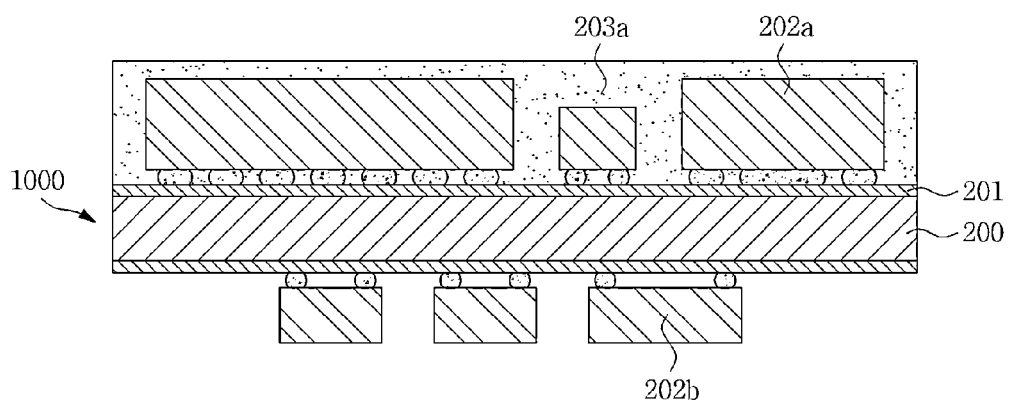

Next, referring to FIG. 13, electronic devices 202b are mounted on the lower surface of the substrate 200.

Here, the electronic device 202 includes various devices, such as passive devices and active devices, which are mounted on the upper and lower surfaces of the substrate 200 and any device which may be mounted on the substrate 200 may be used as the electronic devices.

All the electronic devices 202 may be mounted on the upper and lower surfaces of the substrate 200.

The electronic devices 202 may be disposed on both surfaces of the substrate 200 in various forms, depending on its size or shape and a design of the semiconductor package 1000.

Figure 14:
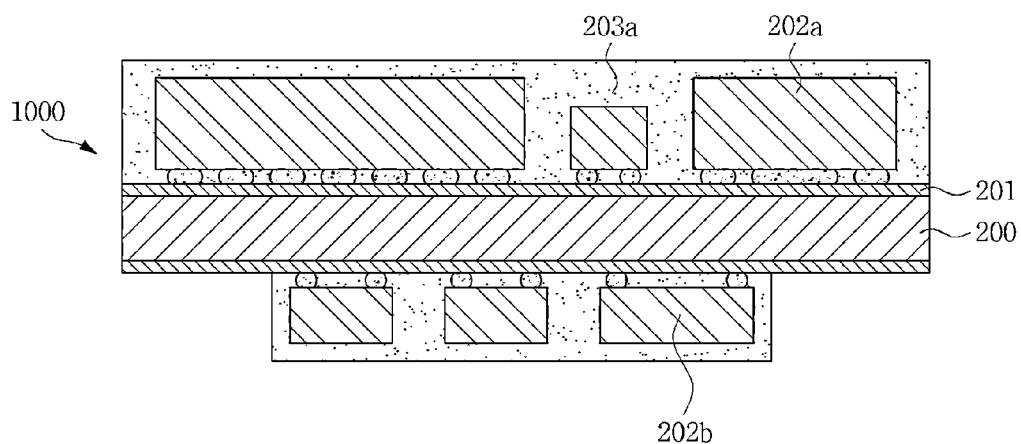

Next, referring to FIG. 14, a molding part 203b is formed on the lower surface of the substrate.

The whole of the electronic device 202b on the lower surface of the substrate 200 is molded.

In this case, since the molding part 203 is formed to be filled on the upper surface of the substrate 200, an adhesion between the molding and the substrate 200 is increased, such that the occurrence of problems, such as delamination between the substrate 200 and the molding material, may be reduced, thereby improving the long-term reliability of the substrate 200.

Further, since the heat blocking is performed due to the molding, a heat dissipation effect may be more improved.

In this case, as the material of the molding part 203, the silicon gel, the epoxy molded compound (EMC), and the like, may be used, but the preferred embodiment of the present invention is not limited thereto.

Figure 15:
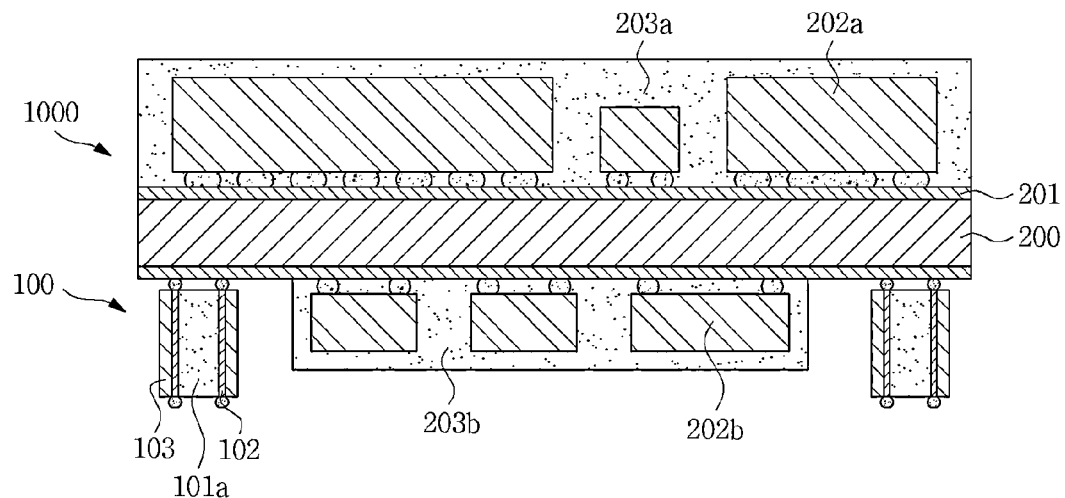

Next, referring to FIG. 15, the semiconductor package 1000 is completed by attaching the external connection terminal parts 100 to the outer sides of the lower surface of the substrate 200, respectively.

In this configuration, the external connection terminal part 100 includes the resin 101a in which the glass fiber is impregnated and the metal plating patterns 102 which are formed on both surfaces of the resin 101a in which the glass fiber is impregnated.

In this case, the resin 101a in which the glass fiber is impregnated may have the plate shape.

As the resin 101a in which the glass fiber is impregnated, a thermosetting resin such as epoxy resin, a thermoplastic resin such as polyimide, a resin having a reinforcement material such as a glass fiber or an inorganic filler impregnated in the thermosetting resin and the thermoplastic resin, for example, a prepreg may be used. In addition, as the insulating material, the thermosetting resin and/or a photo-curable resin, and the like, may be used. However, the resin 101a is not particularly limited thereto.

Here, the metal plating pattern 102 may be manufactured in various forms, including a column form.

The plated surface is thinly formed by performing the electroless plating on both surfaces of the resin 101a in which the glass fiber is impregnated and is then etched to be removed, thereby forming the pattern.

When the thicker plating layer is formed to secure the solder ball contact surface, the electroless plating layer having a thickness of about 1 μm is formed and then the pattern is displayed and suffers from the electroplating to control its thickness.

The insulating coating material 103 which encloses the resin 101a having the glass fiber impregnated therein formed as above and the metal plating patterns 102 formed on both surfaces of the resin 101a having the glass fiber impregnated therein is formed.

In this case, the insulating coating material 103 is formed to expose the metal plating pattern 102 of the external connection terminal part 100.

In this case, as the insulating coating material 103, the silicon gel, the epoxy molded compound (EMC), and the like, may be used, but the preferred embodiment of the present invention is not limited thereto.

The external connection terminal part 100 serves to electrically and physically connect the semiconductor package 1000 to a main substrate (not illustrated) on which the semiconductor package 1000 is mounted.

Further, the external connection terminal part 100 is attached to the substrate 200 by soldering, an adhesive material, or the two attaching methods.

Here, as the soldering, for example, a Sn—Pb eutectic solder or a lead-free solder such as Sn—Ag—Cu may be used. Further, the soldering method may be performed by a process of applying a solder paste using a metal mask. However, the soldering method is not limited thereto.

Further, the adhesive material may be an underfill.

As an underfill solution, the thermosetting resin, such as epoxy resin, phenol resin, melamine resin, and ketone resin or ones made of the precursor (cured or semi-cured thermosetting resin) are mainly used, but the epoxy resin may be mainly used.

The underfill solution has high fluidity, is easily charged even in a narrow space, is easily handled, is cured and then has the solid and excellent mechanical characteristics.

An example of the epoxy resin may include, for example, a bisphenol type epoxy resin, a novolac type epoxy resin, a naphthalene type epoxy resin, a biphenyl type epoxy resin, a cyclopentadiene type epoxy resin, and the like. One kind of these resins may be used alone and a mixture resin of at least two different kinds may also be used.

The external connection terminal parts 100 formed at the outer sides of the lower surface of the substrate 200 may be further molded.

<Another Preferred Embodiment>

FIGS. 16 to 20 are process cross-sectional views sequentially illustrating a method for manufacturing the semiconductor package 1000 having the external connection terminal part 100 according to another preferred embodiment of the present invention.

Figure 16:
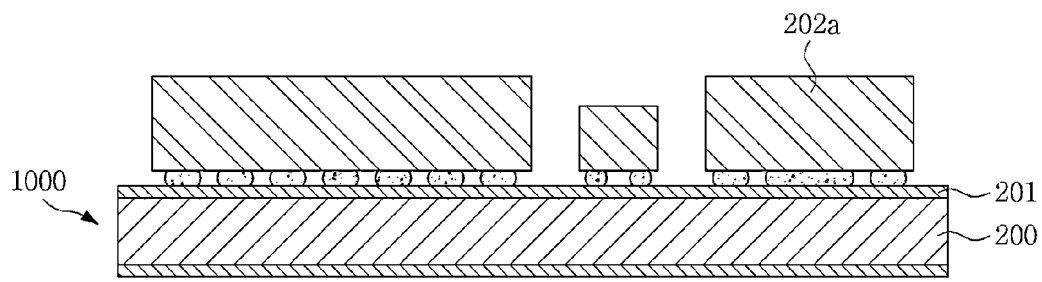
FIGS. 16 to 20 are process cross-sectional views sequentially illustrating a method for manufacturing a semiconductor package having an external connection terminal part according to another preferred embodiment of the present invention.

Referring first to FIG. 16, the substrate 200 on which the double-sided mounting electrode 201 is formed is prepared and the upper surface thereof is mounted with the plurality of electronic devices 202a.

In this case, the substrate 200 on which the double-sided mounting electrode 201 is formed may be made of a material called copper clad lamination (CCL) which has a basic member having a film shape including a resin material and a copper clad layer having patterns formed on both surfaces thereof and as the resin material which is the basic material, a thermosetting resin such as epoxy resin, a thermoplastic resin such as polyimide, polyethylene terephthalate (PET), or a resin having a reinforcement material such as a glass fiber or an inorganic filler impregnated in the thermosetting resin and the thermoplastic resin, for example, a prepreg may be used. In addition, as the resin material, the thermosetting resin and/or a photo-curable resin, and the like, may be used. However, the resin material is not particularly limited thereto.

The substrate 200 is provided with the copper clad layer having the patterns formed on both surfaces thereof and may be called a connection pad or/and a circuit layer.

If the connection pad or/and the circuit layer having the patterns formed on both surfaces thereof are used as a conductive metal, any connection pad or/and circuit layer may be used without being limited and typically copper may be used in the printed circuit board.

The substrate 200 may be a circuit board formed with a circuit of at least one layer, preferably, may be a printed circuit board.

For convenience of explanation, a detailed configuration of an inner layer circuit is not illustrated in FIG. 8, but it may be sufficiently recognized by those skilled in the art that a general circuit board on which the circuit of at least one layer is formed on the insulating layer may be used.

At least one electronic device 202 is mounted on both surfaces of the substrate 200, respectively. Further, wiring patterns for electrically connecting between the mounting electrodes 201 for mounting the electronic devices 202 may be formed on both surfaces of the substrate 200.

Figure 17:
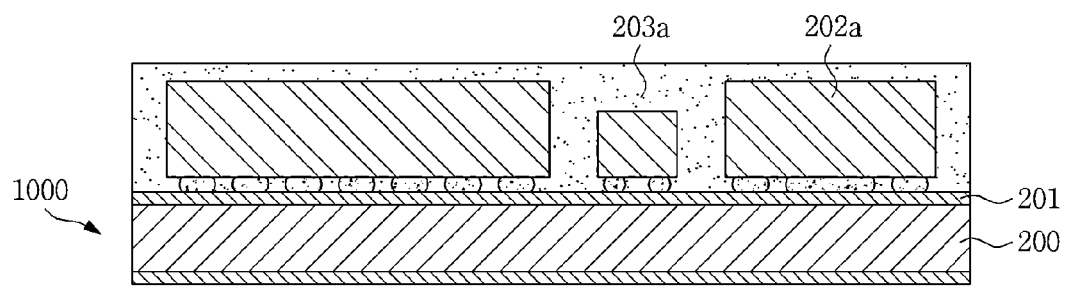

Next, referring to FIG. 17, the molding part 203a is formed on the upper surface of the substrate 200.

In this case, the whole of the electronic device 202a on the upper surface of the substrate and the mounted upper surface thereof is molded.

Figure 18:
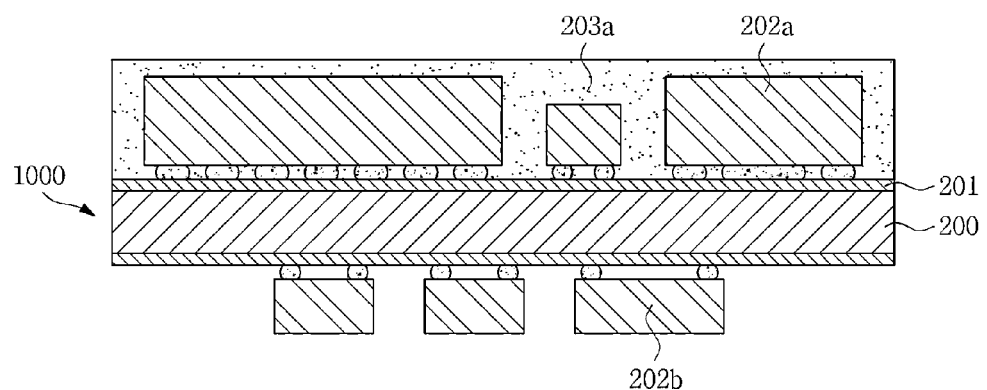

Next, referring to FIG. 18, the electronic devices 202b are mounted on the lower surface of the substrate 200.

Here, the electronic device 202 includes various devices, such as passive devices and active devices, which are mounted on the upper and lower surfaces of the substrate 200 and any device which may be mounted on the substrate 200 may be used as the electronic devices.

All the electronic devices 202 may be mounted on the upper and lower surfaces of the substrate 200.

The electronic devices 202 may be disposed on both surfaces of the substrate 200 in various forms, depending on its size or shape and a design of the semiconductor package 1000.

Figure 19:
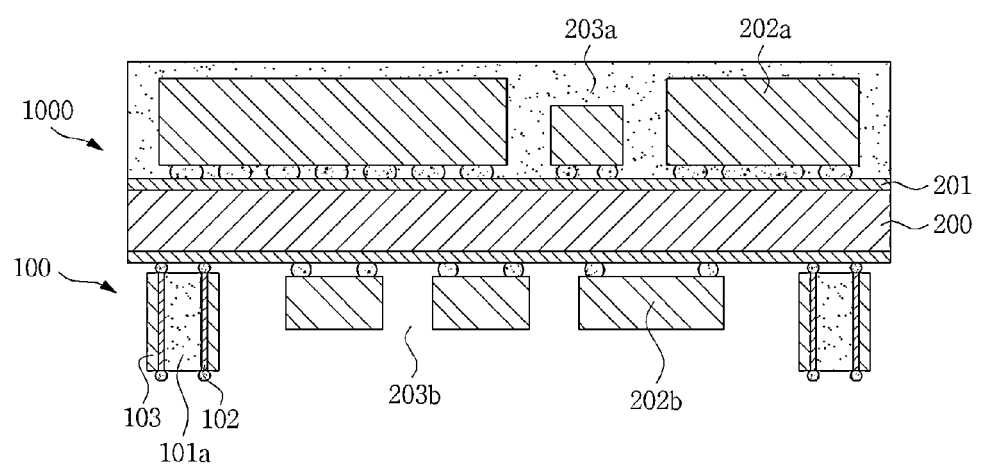

Next, referring to FIG. 19, the semiconductor package 1000 is completed by attaching the external connection terminal parts 100 to the outer sides of the lower surface of the substrate 200, respectively.

In this configuration, the external connection terminal part 100 includes the resin 101a in which the glass fiber is impregnated and the metal plating patterns 102 which are formed on both surfaces of the resin 101a in which the glass fiber is impregnated.

In this case, the resin 101a in which the glass fiber is impregnated may have the plate shape.

As the resin 101a in which the glass fiber is impregnated, a thermosetting resin such as epoxy resin, a thermoplastic resin such as polyimide, a resin having a reinforcement material such as a glass fiber or an inorganic filler impregnated in the thermosetting resin and the thermoplastic resin, for example, a prepreg may be used. In addition, as the insulating material, the thermosetting resin and/or a photo-curable resin, and the like, may be used. However, the resin 101a is not particularly limited thereto.

Here, the metal plating pattern 102 may be manufactured in various forms, including a column form.

The plated surface is thinly formed by performing the electroless plating on both surfaces of the resin 101a in which the glass fiber is impregnated and is then etched to be removed, thereby forming the pattern.

When the thicker plating layer is formed to secure the solder ball contact surface, the electroless plating layer having a thickness of about 1 μm is formed and then the pattern is displayed and suffers from the electroplating to control its thickness.

The insulating coating material 103 which encloses the resin 101a having the glass fiber impregnated therein formed as above and the metal plating patterns 102 formed on both surfaces of the resin 101a having the glass fiber impregnated therein is formed.

In this case, the insulating coating material 103 is formed to expose the metal plating pattern 102 of the external connection terminal part 100.

In this case, as the insulating coating material 103, the silicon gel, the epoxy molded compound (EMC), and the like, may be used, but the preferred embodiment of the present invention is not limited thereto.

The external connection terminal part 100 serves to electrically and physically connect the semiconductor package 1000 to a main substrate (not illustrated) on which the semiconductor package 1000 is mounted.

Further, the external connection terminal part 100 is attached to the substrate 200 by soldering, an adhesive material, or the two attaching methods.

Here, as the soldering, for example, a Sn—Pb eutectic solder or a lead-free solder such as Sn—Ag—Cu may be used. Further, the soldering method may be performed by a process of applying a solder paste using a metal mask. However, the soldering method is not limited thereto.

Further, the adhesive material may be an underfill.

As an underfill solution, the thermosetting resin, such as epoxy resin, phenol resin, melamine resin, and ketone resin or ones made of the precursor (cured or semi-cured thermosetting resin) are mainly used, but the epoxy resin may be mainly used.

The underfill solution has high fluidity, is easily charged even in a narrow space, is easily handled, is cured and then has the solid and excellent mechanical characteristics.

An example of the epoxy resin may include, for example, a bisphenol type epoxy resin, a novolac type epoxy resin, a naphthalene type epoxy resin, a biphenyl type epoxy resin, a cyclopentadiene type epoxy resin, and the like. One kind of these resins may be used alone and a mixture resin of at least two different kinds may also be used.

Figure 20:
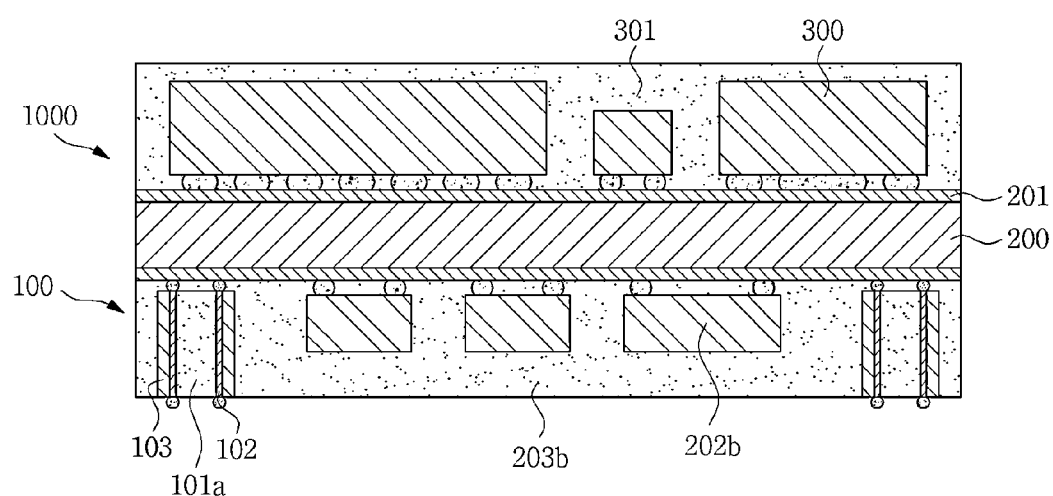

Next, referring to FIG. 20, the molding part 203b is formed on the lower surface of the substrate.

The whole of the electronic device 202b on the lower surface of the substrate 200 and the mounted lower surface thereof is molded.

In this case, since the molding part 203 is formed to be filled on the upper surface of the substrate 200, an adhesion between the molding and the substrate 200 is increased, such that the occurrence of problems, such as delamination between the substrate 200 and the molding material, may be reduced, thereby improving the long-term reliability of the substrate 200.

Further, since the heat blocking is performed due to the molding, a heat dissipation effect may be more improved.

In this case, as the material of the molding part 203, the silicon gel, the epoxy molded compound (EMC), and the like, may be used, but the preferred embodiment of the present invention is not limited thereto.

Here, the molding part 203 is sequentially formed on the upper surface of the substrate and then on the lower surface thereof and the molding parts 203 may be simultaneously formed on the upper and lower surfaces thereof.

When the molding parts 203 are simultaneously formed on the upper and lower surfaces of the substrate, the plurality of electronic devices 202 are first mounted on the upper and lower surfaces of the substrate 200 and then the external connection terminal parts 100 are attached to the outer sides of the lower surface of the substrate 200, respectively.

In this case, the external connection terminal part 100 serves as the support and therefore may suffer from the transfer molding process. However, if necessary, the external connection terminal part 100 may be formed by the injection molding process.

At the time of performing the transfer molding process, the same amount of molding material is injected onto the upper and lower surfaces based on the substrate 200 to be able to control the occurrence of warpage due to the contraction of materials, such as the epoxy molded compound (EMC).

According to the preferred embodiment of the present invention, the external connection terminal part 100 may be implemented to have the designer's desired shape by plating the resin 101a in which the glass fiber is impregnated with the conductive material in various patterns and may be easily formed as the fine pattern.

Further, the external connection terminal part may be mass produced and may be cut at the desired size to simplify the process and save the process costs.

The semiconductor package 1000 having the external connection terminal part 100 according to the preferred embodiment of the present invention may be manufactured by the simple process and have the reduced process costs by forming the external connection terminal part 100 and attaching the external connection terminal part 100 to the package by the simple method.

Further, the external connection terminal part 100 is finely implemented to be able to miniaturize the semiconductor package 1000.

According to the preferred embodiments of the present invention, the external connection terminal part may be implemented to have the designer's desired shape by plating the insulating material with the conductive material in various patterns and may be easily formed as the fine pattern.

Further, the external connection terminal part may be mass produced and may be cut at the desired size to simplify the process and save the process costs.

In addition, according to the preferred embodiments of the present invention, the semiconductor package having the external connection terminal part may be manufactured by the simple process and have the reduced process costs by forming the external connection terminal part and attaching the external connection terminal part to the package by the simple method.

Moreover, the semiconductor package may be miniaturized by implementing the fine external connection terminal part.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An external connection terminal part, comprising:
   an insulating material; and
   metal plating patterns formed on both sides of the insulating material, wherein a whole lower and upper surfaces of the insulating material are exposed.

2. The external connection terminal part as set forth in claim 1, wherein the insulating material has a plate shape.

3. The external connection terminal part as set forth in claim 1, further comprising:
   an insulating coating material formed to expose the metal plating patterns formed on both surfaces of the insulating material.

4. A method for manufacturing an external connection terminal part, comprising:
   preparing an insulating material;
   forming metal plating patterns on both sides of the insulating material; and
   exposing surfaces of the metal plating pattern by exposing a whole lower and upper surfaces of the insulating material, which face each other.

5. The method as set forth in claim 4, wherein the insulating material has a plate shape.

6. The method as set forth in claim 4, further comprising:
   after the forming of the metal plating patterns, forming an insulating coating material to expose the metal plating patterns on both surfaces of the insulating material.

7. The method as set forth in claim 4, further comprising:
   after the forming of the metal plating patterns, exposing surfaces of the metal plating patterns by polishing two opposite surfaces of the insulating material.

8. The method as set forth in claim 4, further comprising:
   after the forming of the metal plating patterns, exposing surfaces of the metal plating patterns by cutting the two opposite surfaces of the insulating material.

9. The method as set forth in claim 4, further comprising:
   after the forming of the metal plating patterns, cutting the insulating material in a plurality of units.

10. A semiconductor package, comprising:
    a substrate on which a double-sided mounting electrode is formed;
    a plurality of electronic devices mounted on both surfaces of the substrate; and external connection terminal parts each attached to outer sides of a lower surface of the substrate, wherein the external connection terminal part includes a resin in which a glass fiber is impregnated and metal plating patterns formed on both surfaces of the resin.

11. The semiconductor package as set forth in claim 10, wherein the resin has a plate shape.

12. The semiconductor package as set forth in claim 10, further comprising:

an insulating coating material formed to expose the metal plating patterns formed on both surfaces of the resin.

13. The semiconductor package as set forth in claim 10, wherein the external connection terminal part is attached to the substrate by soldering, an adhesive material, or the two attaching methods.

14. A method for manufacturing a semiconductor package, comprising:

mounting a plurality of electronic devices on an upper surface of a substrate on which a double-sided mounting electrode is formed;

mounting the plurality of electronic devices on a lower surface of the substrate; and attaching external connection terminal parts each disposed at outer sides of a lower surface of the substrate, wherein the external connection terminal part includes a resin in which a glass fiber is impregnated and metal plating patterns formed on both surfaces of the resin.

15. The method as set forth in claim 14, further comprising:

forming an insulating coating material so as to expose the metal plating patterns formed on both surfaces of the resin.

16. The method as set forth in claim 14, wherein the external connection terminal part is attached to the substrate by soldering, an adhesive material, or the two attaching methods.

17. The method as set forth in claim 14, further comprising:

after the mounting of the electronic device on the upper surface of the substrate, forming a molding part on the upper surface of the substrate to cover the whole of the electronic device mounted on the upper surface of the substrate and the upper surface of the substrate.

18. The method as set forth in claim 14, further comprising:

after the mounting of the electronic device on the lower surface of the substrate, forming a molding part on the lower surface of the substrate to cover the whole of the electronic device mounted on the lower surface of the substrate.

19. The method as set forth in claim 14, further comprising:

after the connecting of the external connection terminal part to an outer side the lower surface of the substrate, forming a molding part on the whole of the lower surface of the substrate to cover the electronic device mounted on the lower surface of the substrate and the external connection terminal part.

20. The method as set forth in claim 14, wherein the molding part is formed by transfer or injection molding.

* * * * *